(12) United States Patent
Wohlmuth et al.

(10) Patent No.: US 9,136,345 B1
(45) Date of Patent: Sep. 15, 2015

(54) METHOD TO PRODUCE HIGH ELECTRON MOBILITY TRANSISTORS WITH BORON IMPLANTED ISOLATION

(71) Applicant: WIN Semiconductors Corp., Tao Yuan Shien (TW)

(72) Inventors: Walter Tony Wohlmuth, Tao Yuan Shien (TW); Wei-Chou Wang, Tao Yuan Shien (TW); Jhih-Han Du, Tao Yuan Shien (TW); Yao-Chung Hsieh, Tao Yuan Shien (TW); Shih Hui Huang, Tao Yuan Shien (TW)

(73) Assignee: WIN Semiconductors Corp., Tao Yuan Shien (TW)

( * ) Notice: Subject to any disclaimer, the term of this patent is extended or adjusted under 35 U.S.C. 154(b) by 0 days.

(21) Appl. No.: 14/335,718

(22) Filed: Jul. 18, 2014

(30) Foreign Application Priority Data

Apr. 23, 2014 (TW) .............................. 103114725 A

(51) Int. Cl.
*H01L 21/338* (2006.01)
*H01L 29/66* (2006.01)
*H01L 21/761* (2006.01)

(52) U.S. Cl.
CPC ........ *H01L 29/66431* (2013.01); *H01L 21/761* (2013.01)

(58) Field of Classification Search
CPC .................. H01L 21/823807; H01L 29/7843; H01L 29/1075; H01L 29/7783; H01L 21/02378; H01L 21/3144; H01L 21/84; H01L 21/02532; H01L 27/1203; H01L 21/823878; H01L 21/02529; H01L 29/1608; H01L 21/02381; H01L 21/0257; H01L 29/4236; H01L 21/0245; H01L 29/66431
USPC .................................................. 438/172, 375
See application file for complete search history.

(56) References Cited

U.S. PATENT DOCUMENTS

| | | | | |
|---|---|---|---|---|
| 2002/0121648 A1* | 9/2002 | Hsu et al. | ....................... | 257/194 |
| 2004/0266135 A1* | 12/2004 | Dong et al. | .................... | 438/435 |
| 2008/0160730 A1* | 7/2008 | Lee et al. | ....................... | 438/525 |
| 2008/0258243 A1* | 10/2008 | Kuroda et al. | ................ | 257/410 |
| 2012/0012893 A1* | 1/2012 | Nakazawa | ..................... | 257/192 |
| 2013/0210225 A1* | 8/2013 | Lee | ............................... | 438/653 |

* cited by examiner

*Primary Examiner* — Duy T Nguyen
(74) *Attorney, Agent, or Firm* — Muncy, Geissler, Olds & Lowe, P.C.

(57) ABSTRACT

A method to produce high electron mobility transistors with Boron implanted isolation comprises the following steps: on a substrate forming in sequence a nucleation layer, a buffer layer, a barrier layer and a cap layer; coating a photoresist layer on the cap layer; photomasking and by exposure eliminating the photoresist layer of at least one isolation region; executing plural times an ion implantation process including: adjusting an incident angle of a Boron ion beam with respect to the substrate, and implanting the Boron ion beam into the cap layer, the barrier layer, the buffer layer, the nucleation layer and the substrate within the at least one isolation region so as to form an isolation structure while rotating the substrate by a rotation angle; eliminating the rest of the photoresist layer by exposure; and forming a source, a drain and a gate on the cap layer.

19 Claims, 10 Drawing Sheets

METHOD TO PRODUCE HIGH ELECTRON MOBILITY TRANSISTORS WITH BORON IMPLANTED ISOLATION

FIELD OF THE INVENTION

The present invention relates to a method to produce high electron mobility transistors with Boron implanted isolation structure, with enhanced electrical isolation and reduced the leakage phenomenon. The high electron mobility transistors with Boron implanted isolation structure may be produced under room temperature that may prevent the phenomenon of activation so as to preserve the electrical isolation.

BACKGROUND OF THE INVENTION

There are mainly two ways for producing high electron mobility transistors with isolation structure in conventional technique. One is the mesa etching, by etching the device non-active regions to fabricate the isolation structure; the other is ion implantation, by implanting ion beam into the device non-active regions to produce the isolation structure. The disadvantage of the mesa etching is that the mesa sidewall of the device active regions may lead to increasing the leakage current and also reducing the breakdown voltage. The deeper the mesa sidewall is, the more significant the leakage current is. This greatly influences on the performance of the high electron mobility transistors. Compared with the mesa etching for producing high electron mobility transistors with isolation structure, the ion implantation method saves lots of time and costs of the etching processes and the ion implanted isolation structure may reduce the leakage current problem, and in addition lower the minimum noise figure. However ion implantation isolation structure may be achieved by different types of ion beam. Usually the ion implantation isolation structure is fabricated under high temperature environment because of the physical properties of the ions the conventional technique used. For example, to produce nitrogen ion implantation isolation structure, the temperature usually needs to be around 250° C. to 300° C. During the ion implantation processes or some other processes after ion implantation processes, the implanted nitrogen ions may be activated and the isolation may be reordering because of the temperature during these processes. Hence, this will affect the electrical isolation and lead to increasing the leakage current. Accordingly, the inventor has developed a new design of the method to produce the high electron mobility transistors with isolation structure to solve the above problems. Using the new method, the ion implantation isolation structure may be produced under room temperature, the phenomenon of activation caused by high temperature may be reduced and high electrical isolation with high repeatability and high reproducibility may be preserved.

SUMMARY OF THE INVENTION

The present invention intends to solve two technical problems: First, to enhance the electrical isolation of the high electron mobility transistors for preventing the leakage current; second, to produce the ion implantation isolation structure of the high electron mobility transistors under room temperature for preventing the phenomenon of activation and preserving the electrical isolation.

In order to solve the problems of prior art and to achieve the expected effect stated above, the present invention provides a method to produce high electron mobility transistors with Boron implanted isolation. The method comprises the following steps: forming a nucleation layer on a substrate; forming a buffer layer on said nucleation layer; forming a barrier layer on said buffer layer; coating a photoresist layer on said barrier layer; photomasking at least one isolation region on the surface of said photoresist layer; eliminating said photoresist layer within said at least one isolation region by exposure and development; executing an ion implantation process plural times, wherein said ion implantation process includes the following steps: step one: adjusting an incident angle of the incident direction of a Boron ion beam with respect to said substrate; and step two: rotating said substrate by a rotation angle; and while rotating said rotation angle, implanting said Boron ion beam by said incident angle into said barrier layer, said buffer layer, said nucleation layer and said substrate within said at least one isolation region so as to enhance the electrical isolation by Boron implantation to form an isolation structure, wherein said isolation structure comprises said Boron implanted barrier layer, said Boron implanted buffer layer, said Boron implanted nucleation layer and said Boron implanted substrate within said at least one isolation region; and said Boron ion beam is unable to penetrate through said photoresist layer, so that the region outside of said at least one isolation region is not implanted by said Boron ion beam; and wherein said incident angle is between 0 degree and 10 degrees and said rotation angle is between 15 degrees and 30 degrees; eliminating the rest of said photoresist layer by exposure and development; forming a source on one end of said barrier layer; forming a drain on the other end of said barrier layer; and forming a gate on said barrier layer, wherein said gate is between said source and said drain.

In an embodiment, which includes the steps: forming a cap layer on said barrier layer after forming said barrier layer and before coating said photoresist; and then forming said photoresist layer on said cap layer, such that said cap layer is between said barrier layer and said photoresist layer; wherein said Boron ion beam is implanted into said cap layer, said barrier layer, said buffer layer, said nucleation layer and said substrate within said at least one isolation region so as to form said isolation structure, and said isolation structure comprises said Boron implanted cap layer, said Boron implanted barrier layer, said Boron implanted buffer layer, said Boron implanted nucleation layer and said Boron implanted substrate within said at least one isolation region; wherein said source is formed on one end of said cap layer; said drain is formed on the other end of said cap layer; said gate is formed on said cap layer, wherein said gate is between said source and said drain; and forming a source-coupled field plate overtop of said gate, wherein said source-coupled field plate is between said source and drain.

In another embodiment, said cap layer is made of GaN.

In one embodiment, said cap layer is made of Si doped GaN, or n+ type GaN.

In an embodiment, said executed ion implantation processes include the following four ion implantation processes: one first ion implantation process, wherein the implantation energy of said Boron ion beam is between 10 KeV and 50 KeV, and the Boron ions of said Boron ion beam are at a dose of $10^{11}/cm^{-3}$ to $10^{13}/cm^{-3}$; two second ion implantation processes, wherein the implantation energy of said Boron ion beam is between 50 KeV and 200 KeV, and the Boron ions of said Boron ion beam are at a dose of $10^{12}/cm^{-3}$ to $10^{13}/cm^{-3}$; and one third ion implantation process, wherein the implantation energy of said Boron ion beam is between 200 KeV and 300 KeV, and the Boron ions of said Boron ion beam are at a dose of $10^{12}/cm^{-3}$ to $10^{13}/cm^{-3}$.

In another embodiment, said substrate is made of SiC; said nucleation layer is made of AlN; said buffer layer is made of GaN; and said barrier layer is made of AlGaN.

In one embodiment, said incident angle is between 3 degrees and 9 degrees, and said rotation angle is between 17 degrees and 28 degrees.

In an embodiment, the implantation energy of said Boron ion beam is between 10 KeV and 300 KeV.

In another embodiment, the Boron ions of said Boron ion beam are at a dose of $10^{11}/cm^{-3}$ to $10^{13}/cm^{-3}$.

In one embodiment, said substrate is made of SiC, Si, Diamond, Sapphire or GaN.

In an embodiment, said buffer layer is made of GaN, AlGaN or AN.

In another embodiment, said barrier layer is made of AlGaN or InAlN.

In one embodiment, when executing said ion implantation process plural times, said incident angles used in these processes are the same or different, said rotation angles are the same or different, the implantation energies of said Boron ion beam are the same or different, and the dosages of the Boron ions of said Boron ion beam are the same or different.

In another embodiment, said nucleation layer is made of AlN.

For further understanding the characteristics and effects of the present invention, some preferred embodiments referred to drawings are in detail described as follows.

DETAILED DESCRIPTIONS OF PREFERRED EMBODIMENTS

Figure 1B:
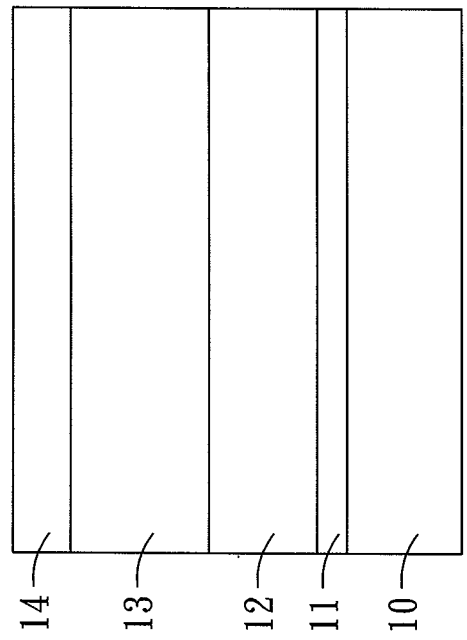
FIG. 1A~1H show the process flow diagram of an embodiment of the present invention.
Figure 1A:
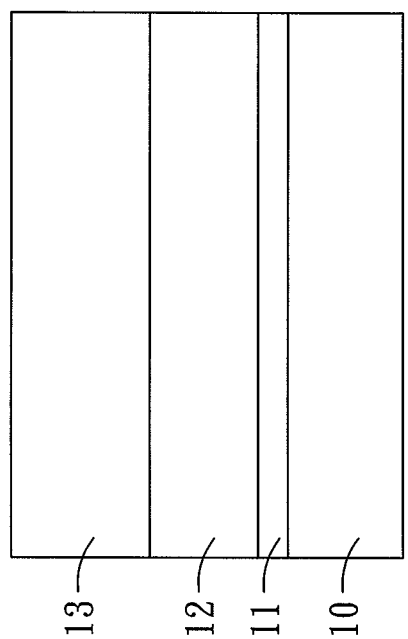

First embodiment: please refer to FIG. 1A~1H, which show the process flow diagram of an embodiment of the present invention. Forming the structure as shown in FIG. 1A by the following three steps: forming a nucleation layer 11 on a substrate 10; forming a buffer layer 12 on the nucleation layer 11 and forming a barrier layer 13 on the buffer layer 12. After these three steps, the structure, shown in FIG. 1A, with the substrate 10, the nucleation layer 11, the buffer layer 12 and the barrier layer 13 is formed.

The substrate 10 is made of SiC, Si, Diamond, Sapphire or GaN; the nucleation layer 11 is made of AlN; the buffer layer 12 is made of GaN, AlGaN or AN; and the barrier layer 13 is made of AlGaN or InAlN.

Please refer to FIG. 1B, which shows the step: coating a photoresist layer 14 on the barrier layer 13.

Figure 1C:
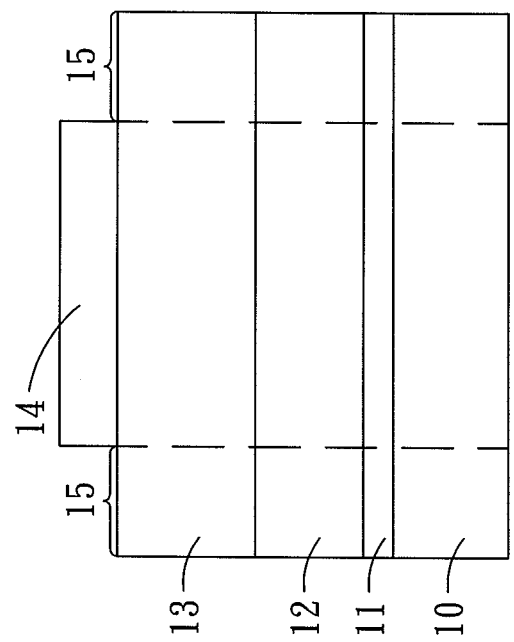

Please refer to FIG. 1C, which shows the step: photomasking at least one isolation region 15 on the surface of the photoresist layer 14.

Figure 1D:
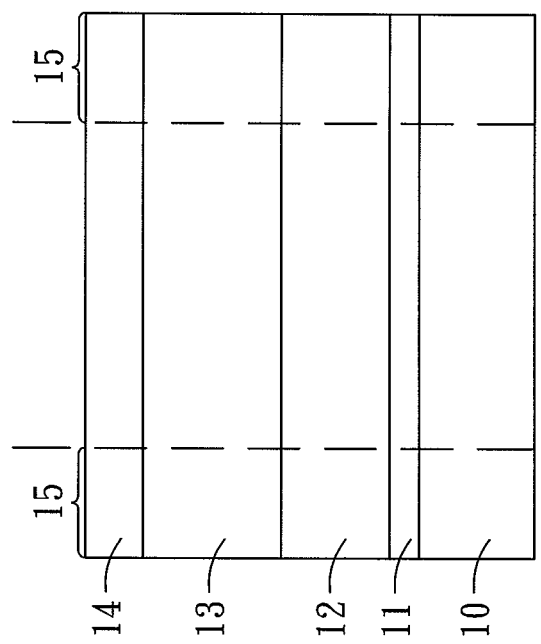

Please refer to FIG. 1D, which shows the step: eliminating the photoresist layer 14 within the at least one isolation region 15 by exposure and development.

Figure 1E:
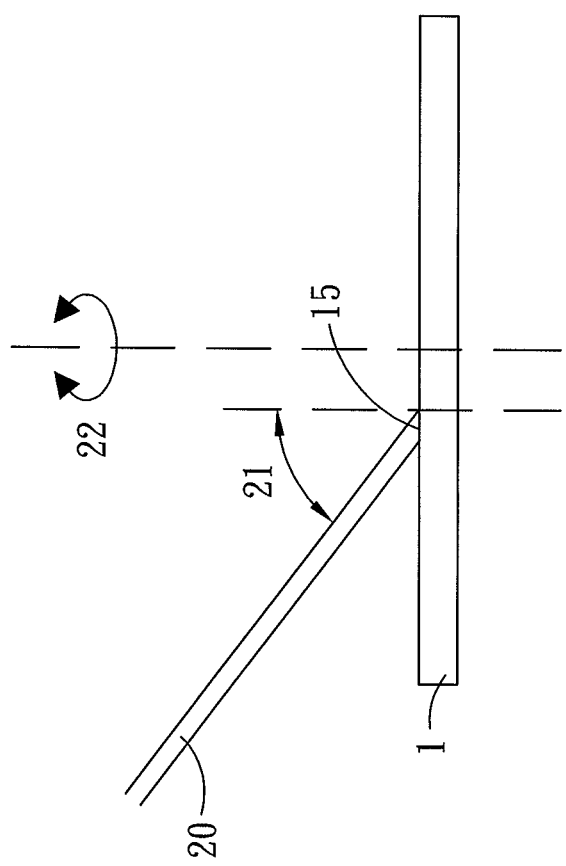
Figure 1F:
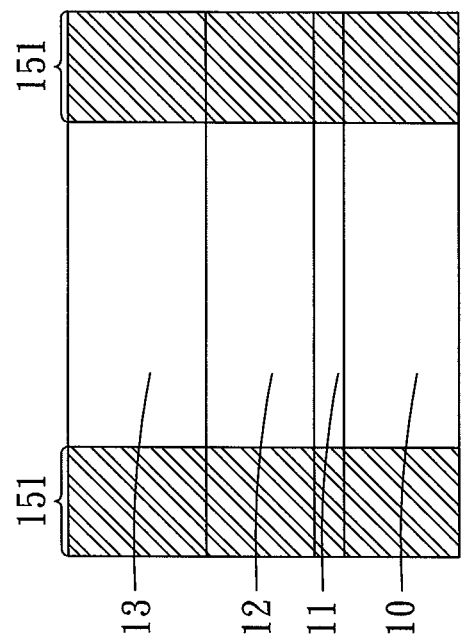

Please refer to FIGS. 1D, 1E and 1F, which show the difference before and after executing an ion implantation process plural times. The ion implantation process includes the following steps: step one: adjusting an incident angle 21 of the incident direction of a Boron ion beam 20 with respect to the substrate 10 (that is, as shown in FIG. 1E, adjusting an incident angle 21 of the incident direction of a Boron ion beam 20 with respect to an epitaxial structure 1 on the substrate); and step two: rotating the substrate 10 by a rotation angle 22; and while rotating the rotation angle 22, implanting the Boron ion beam 20 by the incident angle 21 into the barrier layer 13, the buffer layer 12, the nucleation layer 11 and the substrate 10 within the at least one isolation region 15 so as to enhance the electrical isolation by Boron implantation to form an isolation structure 151, as shown in the oblique lines section in FIG. 1F. The isolation structure 151 comprises the Boron implanted barrier layer 13, the Boron implanted buffer layer 12, the Boron implanted nucleation layer 11 and the Boron implanted substrate 10 within the at least one isolation region 15; and the Boron ion beam 20 is unable to penetrate through the photoresist layer 14, so that the region outside of the at least one isolation region 15 is not implanted by the Boron ion beam 20.

When executing the ion implantation process plural times, the incident angles 21 used in these processes may be the same or different, the rotation angles 22 may be the same or different, the implantation energies of the Boron ion beam 20 may be the same or different, and the dosages of the Boron ions of the Boron ion beam 20 may be the same or different.

Figure 1G:
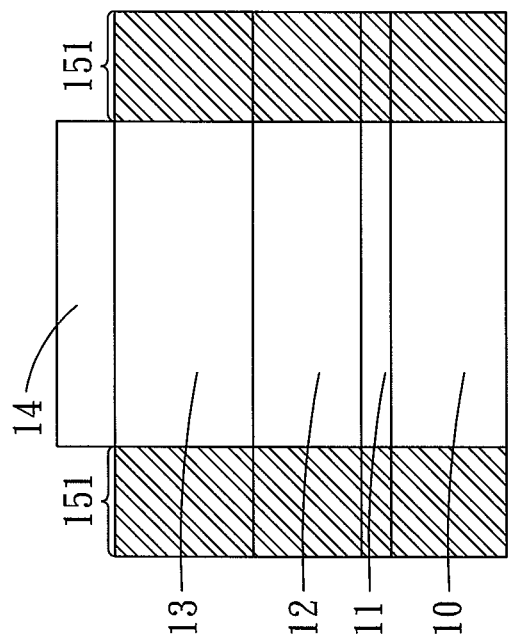

Please refer to FIG. 1G, which shows the step: eliminating the rest of the photoresist layer 14 by exposure and development.

Figure 1H:
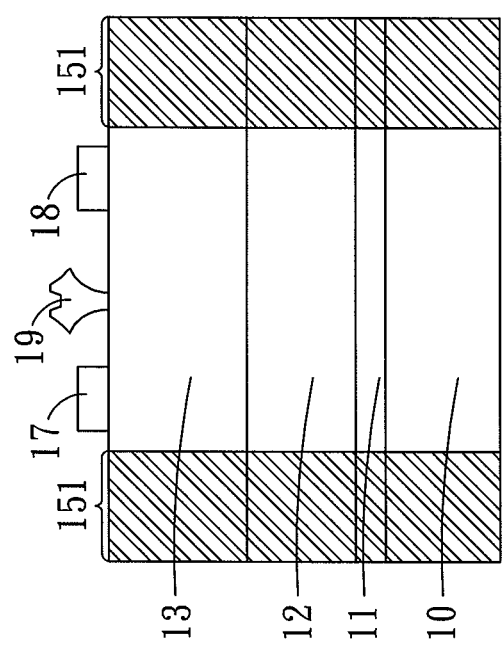

Please refer to FIG. 1H, which includes three steps: forming a source 17 on one end of the barrier layer 13; forming a drain 18 on the other end of the barrier layer 13; and forming a gate 19 on the barrier layer 13, wherein the gate 19 is between the source 17 and the drain 18; and forming a source-coupled field plate overtop of said gate, wherein said source-coupled field plate is between said source and drain.

In the first embodiment, the incident angle 21 is between 0 degree and 10 degrees.

In the first embodiment, the rotation angle 22 is between 15 degrees and 30 degrees.

In the first embodiment, the implantation energy of the Boron ion beam 20 is between 10 KeV and 300 KeV.

In the first embodiment, the Boron ions of the Boron ion beam 20 are at a dose of $10^{11}/cm^{-3}$ to $10^{13}/cm^{-3}$.

Second Embodiment which is mostly the same as the first embodiment except that executing an ion implantation process plural times includes the following four ion implantation processes: one first ion implantation process, wherein the implantation energy of the Boron ion beam 20 is between 10 KeV and 50 KeV, and the Boron ions of the Boron ion beam 20 are at a dose of $10^{11}/cm^{-3}$ to $10^{13}/cm^{-3}$; two second ion implantation processes, wherein the implantation energy of the Boron ion beam 20 is between 50 KeV and 200 KeV, and the Boron ions of the Boron ion beam 20 are at a dose of $10^{12}/cm^{-3}$ to $10^{13}/cm^{-3}$; and one third ion implantation process, wherein the implantation energy of the Boron ion beam 20 is between 200 KeV and 300 KeV, and the Boron ions of the Boron ion beam 20 are at a dose of $10^{12}/cm^{-3}$ to $10^{13}/cm^{-3}$.

In the second embodiment, the substrate 10 is made of SiC; the nucleation layer 11 is made of AlN; the buffer layer 12 is made of GaN; and the barrier layer 13 is made of AlGaN; the incident angle 21 is between 3 degrees and 9 degrees; and the rotation angle 22 is between 17 degrees and 28 degrees.

Figure 2B:
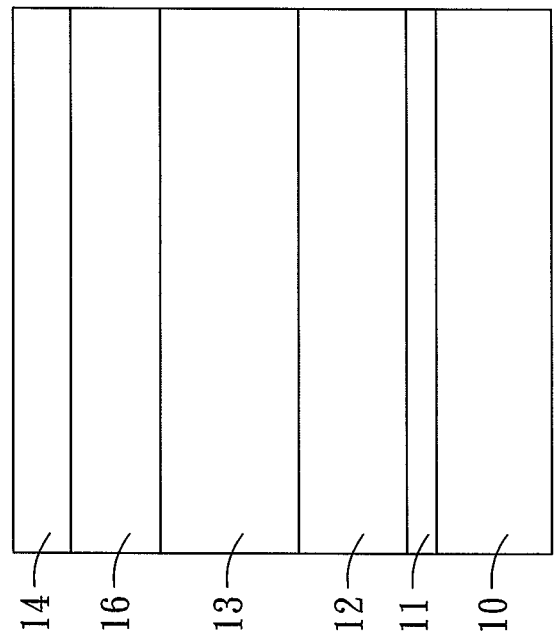
FIG. 2A~2H show the process flow diagram of another embodiment of the present invention.
Figure 2A:
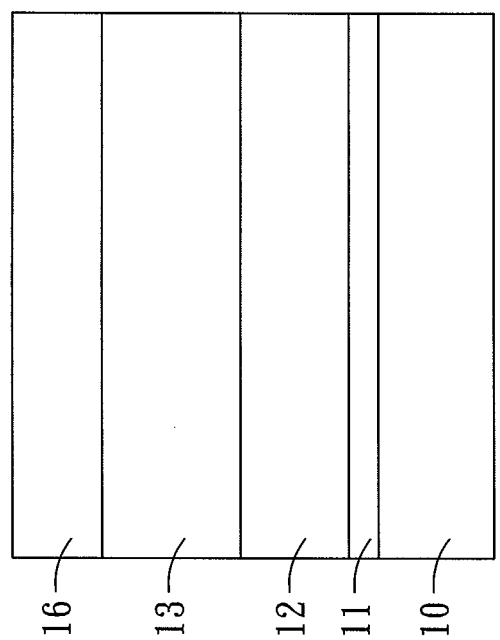

Third Embodiment please refer to FIG. 2A~2H, which show the process flow diagram of an embodiment of the present invention. Forming the structure as shown in FIG. 2A by the following four steps:

forming a nucleation layer 11 on a substrate 10; forming a buffer layer 12 on the nucleation layer 11; forming a barrier layer 13 on the buffer layer 12 and forming a cap layer 16 on the barrier layer 13. After these four steps, the structure, shown in FIG. 2A, with the substrate 10, the nucleation layer 11, the buffer layer 12, the barrier layer 13 and the cap layer 16 is formed.

The substrate 10 is made of SiC, Si, Diamond, Sapphire or GaN; the nucleation layer 11 is made of AlN; the buffer layer 12 is made of GaN, AlGaN or AlN; the barrier layer 13 is made of AlGaN or InAlN; and the cap layer is made of GaN.

Please refer to FIG. 2B, which shows the step: coating a photoresist layer 14 on the cap layer 16.

Figure 2D:
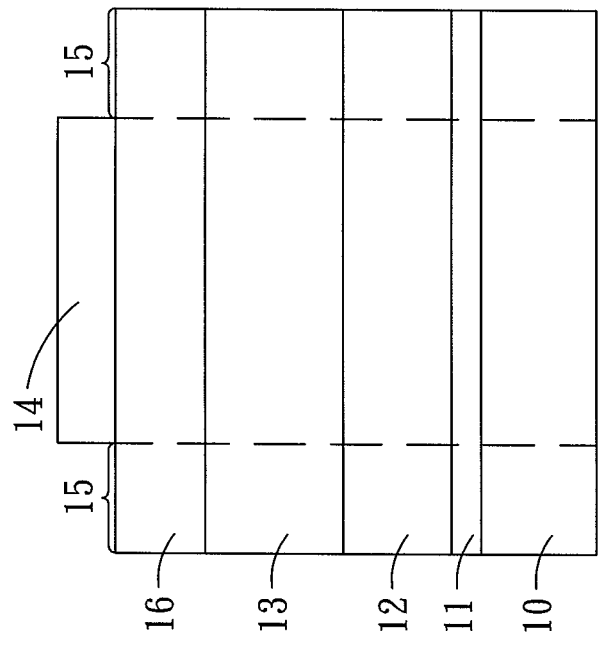
Figure 2C:
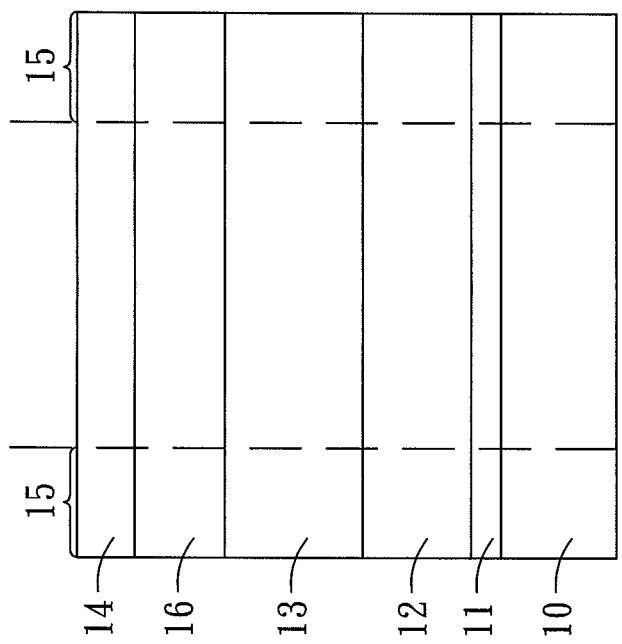

Please refer to FIG. 2C, which shows the step: photomasking at least one isolation region 15 on the surface of the photoresist layer 14.

Please refer to FIG. 2D, which shows the step: eliminating the photoresist layer 14 within the at least one isolation region 15 by exposure and development.

Figure 2E:
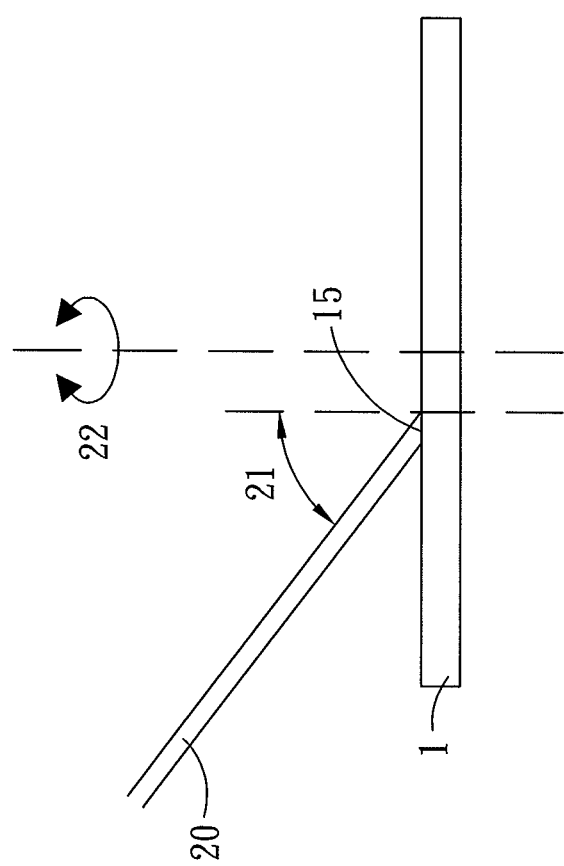
Figure 2G:
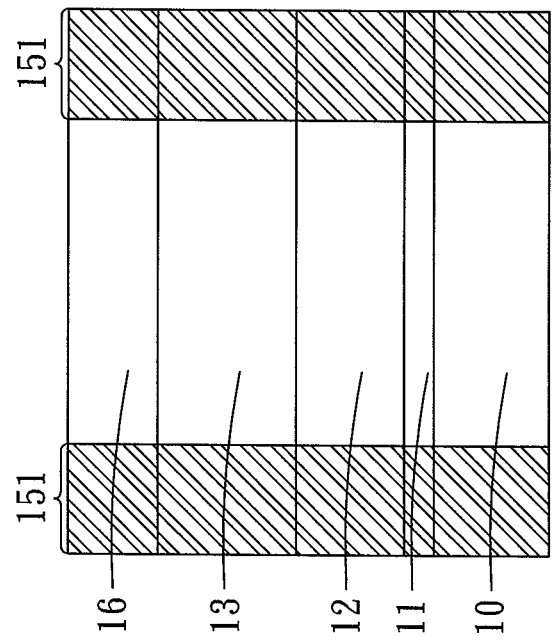
Figure 2F:
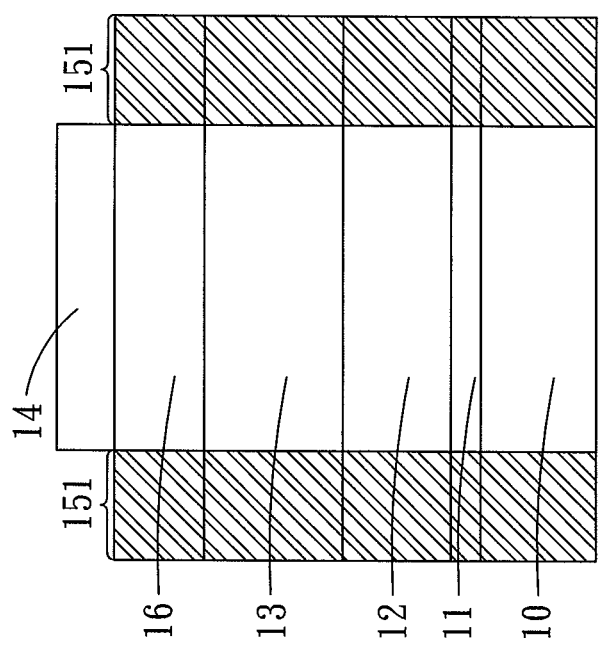

Please refer to FIGS. 2D, 2E and 2F, which show the difference before and after executing an ion implantation process plural times. The ion implantation process includes the following steps: step one: adjusting an incident angle 21 of the incident direction of a Boron ion beam 20 with respect to the substrate 10 (that is, as shown in FIG. 2E, adjusting an incident angle 21 of the incident direction of a Boron ion beam 20 with respect to an epitaxial structure 1 on the substrate); and step two: rotating the substrate 10 by a rotation angle 22; and while rotating the rotation angle 22, implanting the Boron ion beam 20 by the incident angle 21 into the cap layer 16, the barrier layer 13, the buffer layer 12, the nucleation layer 11 and the substrate 10 within the at least one isolation region 15 so as to enhance the electrical isolation by Boron implantation to form an isolation structure 151, as shown in the oblique lines section in FIG. 2F. The isolation structure 151 comprises the Boron implanted cap layer 16, the Boron implanted barrier layer 13, the Boron implanted buffer layer 12, the Boron implanted nucleation layer 11 and the Boron implanted substrate 10 within the at least one isolation region 15; and the Boron ion beam 20 is unable to penetrate through the photoresist layer 14, so that the region outside of the at least one isolation region 15 is not implanted by the Boron ion beam 20.

When executing the ion implantation process plural times, the incident angles 21 used in these processes may be the same or different, the rotation angles 22 may be the same or different, the implantation energies of the Boron ion beam 20 may be the same or different, and the dosages of the Boron ions of the Boron ion beam 20 may be the same or different.

Please refer to FIG. 2G, which shows the step: eliminating the rest of the photoresist layer 14 by exposure and development.

Figure 2H:
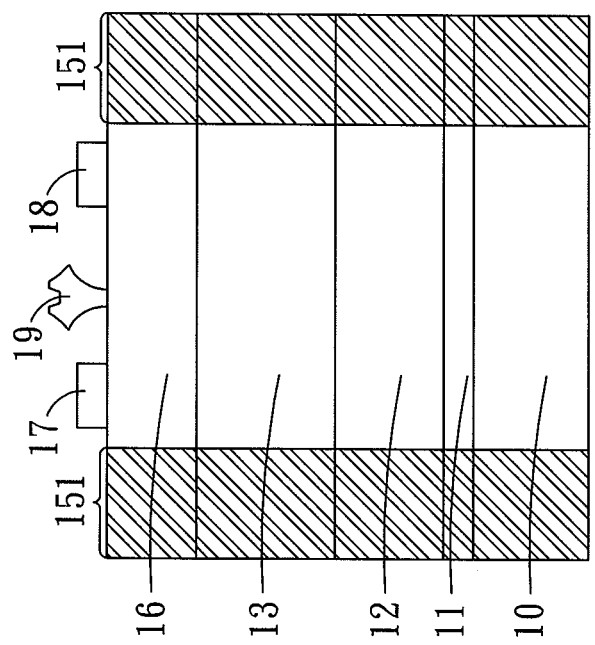

Please refer to FIG. 2H, which includes three steps: forming a source 17 on one end of the cap layer 16; forming a drain 18 on the other end of the cap layer 16; and forming a gate 19 on the cap layer 16, wherein the gate 19 is between the source 17 and the drain 18; and forming a source-coupled field plate overtop of said gate, wherein said source-coupled field plate is between said source and drain.

In the third embodiment, the incident angle 21 is between 0 degree and 10 degrees.

In the third embodiment, the rotation angle 22 is between 15 degrees and 30 degrees.

In the third embodiment, the implantation energy of the Boron ion beam 20 is between 10 KeV and 300 KeV.

In the third embodiment, the Boron ions of the Boron ion beam 20 are at a dose of $10^{11}/cm^{-3}$ to $10^{13}/cm^{-3}$.

In another embodiment, the cap layer 16 is made of Si doped GaN, or n+ type GaN.

Fourth Embodiment which is mostly the same as the third embodiment except that executing an ion implantation process plural times includes the following four ion implantation processes: one first ion implantation process, wherein the implantation energy of the Boron ion beam 20 is between 10 KeV and 50 KeV, and the Boron ions of the Boron ion beam 20 are at a dose of $10^{11}/cm^{-3}$ to $10^{13}/cm^{-3}$; two second ion implantation processes, wherein the implantation energy of the Boron ion beam 20 is between 50 KeV and 200 KeV, and the Boron ions of the Boron ion beam 20 are at a dose of $10^{12}/cm^{-3}$ to $10^{13}/cm^{-3}$; and one third ion implantation process, wherein the implantation energy of the Boron ion beam 20 is between 200 KeV and 300 KeV, and the Boron ions of the Boron ion beam 20 are at a dose of $10^{12}/cm^{-3}$ to $10^{13}/cm^{-3}$.

In the fourth embodiment, the substrate 10 is made of SiC; the nucleation layer 11 is made of AlN; the buffer layer 12 is made of GaN; and the barrier layer 13 is made of AlGaN; the cap layer is made of GaN; the incident angle 21 is between 3 degrees and 9 degrees; and the rotation angle 22 is between 17 degrees and 28 degrees.

As disclosed in the above description and attached drawings, the present invention can provide a method to produce high electron mobility transistors with Boron implanted isolation structure, with enhanced electrical isolation and reduced the leakage phenomenon. The high electron mobility transistors with Boron implanted isolation structure may be produced under room temperature that may prevent the phenomenon of activation so as to preserve the electrical isolation. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A method to produce high electron mobility transistors with Boron implanted isolation comprises the following steps:

forming a nucleation layer on a substrate, wherein said substrate is made of SiC, Si, Diamond or Sapphire;

forming a buffer layer on said nucleation layer;

forming a barrier layer on said buffer layer;

coating a photoresist layer on said barrier layer;

photomasking at least one isolation region on the surface of said photoresist layer;

eliminating said photoresist layer within said at least one isolation region by exposure and development;

executing an ion implantation process plural times, wherein said ion implantation process includes the following steps:

step one: adjusting an incident angle of the incident direction of a Boron ion beam with respect to said substrate; and step two: rotating said substrate by a rotation angle; and while rotating said rotation angle, implanting said Boron ion beam by said incident angle into said barrier layer, said buffer layer, said nucleation layer and said substrate within said at least one isolation region so as to enhance the electrical isolation by Boron implantation to form an isolation structure, wherein said isolation structure comprises said Boron implanted barrier layer, said Boron implanted buffer layer, said Boron implanted nucleation layer and said Boron implanted substrate within said at least one isolation region; and said Boron ion beam is unable to penetrate through said photoresist layer, so that the region outside of said at least one isolation region is not implanted by said Boron ion beam; and wherein said incident angle is between 0 degree and 10 degrees and said rotation angle is between 15 degrees and 30 degrees;

eliminating the rest of said photoresist layer by exposure and development;

forming a source on one end of said barrier layer;

forming a drain on the other end of said barrier layer; and forming a gate on said barrier layer, wherein said gate is between said source and said drain.

2. The method to produce high electron mobility transistors with Boron implanted isolation according to claim 1, forming a cap layer on said barrier layer after forming said barrier layer and before coating said photoresist; and then forming said photoresist layer on said cap layer, such that said cap layer is between said barrier layer and said photoresist layer; wherein said Boron ion beam is implanted into said cap layer, said barrier layer, said buffer layer, said nucleation layer and said substrate within said at least one isolation region so as to form said isolation structure, and said isolation structure comprises said Boron implanted cap layer, said Boron implanted barrier layer, said Boron implanted buffer layer, said Boron implanted nucleation layer and said Boron implanted substrate within said at least one isolation region; wherein said source is formed on one end of said cap layer; said drain is formed on the other end of said cap layer; said gate is formed on said cap layer, wherein said gate is between said source and said drain.

3. The method to produce high electron mobility transistors with Boron implanted isolation according to claim 2, wherein said cap layer is made of GaN.

4. The method to produce high electron mobility transistors with Boron implanted isolation according to claim 3, wherein said cap layer is made of Si doped GaN, or n+ type GaN.

5. The method to produce high electron mobility transistors with Boron implanted isolation according to claim 3, wherein said executed ion implantation processes include the following four ion implantation processes:

one first ion implantation process, wherein the implantation energy of said Boron ion beam is between 10 KeV and 50 KeV, and the Boron ions of said Boron ion beam are at a dose of $10^{11}/cm^{-3}$ to $10^{13}/cm^{-3}$;

two second ion implantation processes, wherein the implantation energy of said Boron ion beam is between 50 KeV and 200 KeV, and the Boron ions of said Boron ion beam are at a dose of $10^{12}/cm^{-3}$ to $10^{13}/cm^{-3}$; and one third ion implantation process, wherein the implantation energy of said Boron ion beam is between 200 KeV and 300 KeV, and the Boron ions of said Boron ion beam are at a dose of $10^{12}/cm^{-3}$ to $10^{13}/cm^{-3}$.

6. The method to produce high electron mobility transistors with Boron implanted isolation according to claim 5, wherein said nucleation layer is made of AN; said buffer layer is made of GaN; and said barrier layer is made of AlGaN.

7. The method to produce high electron mobility transistors with Boron implanted isolation according to claim 5, wherein said incident angle is between 3 degrees and 9 degrees, and said rotation angle is between 17 degrees and 28 degrees.

8. The method to produce high electron mobility transistors with Boron implanted isolation according to claim 2, wherein said executed ion implantation processes include the following four ion implantation processes:

one first ion implantation process, wherein the implantation energy of said Boron ion beam is between 10 KeV and 50 KeV, and the Boron ions of said Boron ion beam are at a dose of $10^{11}/cm^{-3}$ to $10^{13}/cm^{-3}$;

two second ion implantation processes, wherein the implantation energy of said Boron ion beam is between 50 KeV and 200 KeV, and the Boron ions of said Boron ion beam are at a dose of $10^{12}/cm^{-3}$ to $10^{13}/cm^{-3}$; and one third ion implantation process, wherein the implantation energy of said Boron ion beam is between 200 KeV and 300 KeV, and the Boron ions of said Boron ion beam are at a dose of $10^{12}/cm^{-3}$ to $10^{13}/cm^{-3}$.

9. The method to produce high electron mobility transistors with Boron implanted isolation according to claim 8, wherein said nucleation layer is made of AN; said buffer layer is made of GaN; and said barrier layer is made of AlGaN.

10. The method to produce high electron mobility transistors with Boron implanted isolation according to claim 8, wherein said incident angle is between 3 degrees and 9 degrees, and said rotation angle is between 17 degrees and 28 degrees.

11. The method to produce high electron mobility transistors with Boron implanted isolation according to claim 1, wherein said executed ion implantation processes include the following four ion implantation processes:

one first ion implantation process, wherein the implantation energy of said Boron ion beam is between 10 KeV and 50 KeV, and the Boron ions of said Boron ion beam are at a dose of $10^{11}/cm^{-3}$ to $10^{13}/cm^{-3}$;

two second ion implantation processes, wherein the implantation energy of said Boron ion beam is between 50 KeV and 200 KeV, and the Boron ions of said Boron ion beam are at a dose of $10^{12}/cm^{-3}$ to $10^{13}/cm^{-3}$; and one third ion implantation process, wherein the implantation energy of said Boron ion beam is between 200 KeV and 300 KeV, and the Boron ions of said Boron ion beam are at a dose of $10^{12}/cm^{-3}$ to $10^{13}/cm^{-3}$.

12. The method to produce high electron mobility transistors with Boron implanted isolation according to claim 11, wherein said nucleation layer is made of AlN; said buffer layer is made of GaN; and said barrier layer is made of AlGaN.

13. The method to produce high electron mobility transistors with Boron implanted isolation according to claim 11, wherein said incident angle is between 3 degrees and 9 degrees, and said rotation angle is between 17 degrees and 28 degrees.

14. The method to produce high electron mobility transistors with Boron implanted isolation according to claim 1, wherein the implantation energy of said Boron ion beam is between 10 KeV and 300 KeV.

15. The method to produce high electron mobility transistors with Boron implanted isolation according to claim 1, wherein the Boron ions of said Boron ion beam are at a dose of $10^{11}/cm^{-3}$ to $10^{13}/cm^{-3}$.

16. The method to produce high electron mobility transistors with Boron implanted isolation according to claim 1, wherein said buffer layer is made of GaN, AlGaN or AlN.

17. The method to produce high electron mobility transistors with Boron implanted isolation according to claim 1, wherein said barrier layer is made of AlGaN or InAlN.

18. The method to produce high electron mobility transistors with Boron implanted isolation according to claim 1, wherein when executing said ion implantation process plural times, said incident angles used in these processes are the same or different, said rotation angles are the same or different, the implantation energies of said Boron ion beam are the same or different, and the dosages of the Boron ions of said Boron ion beam are the same or different.

19. The method to produce high electron mobility transistors with Boron implanted isolation according to claim 1, wherein said nucleation layer is made of AlN.

* * * * *